United States Patent [19]
Hodko et al.

[11] Patent Number: 5,859,085
[45] Date of Patent: Jan. 12, 1999

[54] STABLE POWDERS MADE FROM PHOTOSENSITIVE POLYCRYSTALLINE COMPLEXES OF HETEROCYCLIC MONOMERS AND THEIR POLYMERS

[75] Inventors: Dalibor Hodko, College Station; Oliver J. Murphy; G. Duncan Hitchens, both of Bryan, all of Tex.

[73] Assignee: Lynntech, Inc., College Station, Tex.

[21] Appl. No.: 787,270

[22] Filed: Jan. 24, 1997

Related U.S. Application Data

[63] Continuation-in-part of Ser. No. 491,625, Jun. 19, 1995, Pat. No. 5,545,308, and Ser. No. 492,235, Jun. 19, 1995.

[51] Int. Cl.⁶ .................................................. C08G 73/06
[52] U.S. Cl. ................................ 522/74; 522/78; 522/79; 522/75; 522/80; 522/167; 522/2; 524/440; 528/423; 526/258
[58] Field of Search ........................ 522/167, 74, 78, 522/79, 80, 75, 2; 524/440; 526/258; 528/423

[56] References Cited

U.S. PATENT DOCUMENTS

| | | | |
|---|---|---|---|
| 4,526,807 | 7/1985 | Auerbach | 427/53.1 |
| 4,769,430 | 9/1988 | Naitoh | 522/167 |
| 5,385,956 | 1/1995 | Schellekens et al. | 522/167 |
| 5,436,108 | 7/1995 | Freedman et al. | 430/200 |

FOREIGN PATENT DOCUMENTS

| 63-234024 | 9/1988 | Japan | 522/167 |
|---|---|---|---|

*Primary Examiner*—Susan W. Berman
*Attorney, Agent, or Firm*—Jeffrey L. Streets

[57] ABSTRACT

The present invention relates to a low electronic conductivity polymer composition having well dispersed metal granules, a stable powder made from photosensitive polycrystalline complexes of pyrrole, or its substituted derivatives and silver cations for making the polymer composition, and methods of forming the stable powder and polymer composition, respectively. A polycrystalline complex of silver and a monomer, such as pyrrole, its substituted derivatives or combinations thereof, is precipitated in the form of a stable photosensitive powder upon addition of the monomer to a solvent solution, such as toluene containing an electron acceptor. The photosensitive powder can be stored in the dark until needed. The powder may be dissolved in a solvent, cast onto a substrate and photopolymerized.

18 Claims, 2 Drawing Sheets

STABLE POWDERS MADE FROM PHOTOSENSITIVE POLYCRYSTALLINE COMPLEXES OF HETEROCYCLIC MONOMERS AND THEIR POLYMERS

This application is a continuation-in-part of U.S. patent application Ser. No. 08/491,625 filed on Jun. 19, 1995 U.S. Pat. No. 5,595,308 and U.S. patent application Ser. No. 08/492,235, filed on Jun. 19, 1995.

BACKGROUND OF THE INVENTION

This invention was made with government support under contract NAS3-26506 awarded by NASA. The government has certain rights in this invention.

FIELD OF THE INVENTION

The present invention relates to the preparation of pyrrole metal complex and the precipitation of this complex to form a white polycrystalline powder that is photosensitive. This polycrystalline powder is used by dissolving in a solvent, casting onto a surface, and photopolymerizing to form metal-loaded polymer film of a low electrically conductivity.

BACKGROUND OF THE RELATED ART

Pyrrole and aniline are monomers that can form a conjugated polymer structures that are electrically conducting. These conducting polymers have become useful in a number of applications. Uses of commercial importance include shielding for electromagnetic radiation, electro-optic devices including storage and transmission applications, high energy density batteries, microelectronic devices, electrochromic windows, displays, sensors, and indicators, electromechanical actuators, semiconductor circuits, redox capacitors, gas separation, and controlled chemical delivery systems.

Both polypyrrole and polyaniline can be formed by chemical or electrochemical techniques. For example, polypyrrole can be electropolymerized from aqueous solutions containing 0.1M pyrrole ($C_4H_4NH$) and 0.1M tosylate ($CH_3(C_6H_4)SO_3Na$) and from nonaqueous acetonitrile solutions with 1% water by volume, where silver nitrate ($AgNO_3$) is the supporting electrolyte. These polymer films may be deposited on platinum and gold working electrodes galvanostatically using an applied current density of 2.0–4.0 mA $cm^{-2}$.

Photopolymerized films of polypyrrole and polyaniline are prepared from solutions containing pyrrole or aniline monomers, along with various additives, such as electron acceptors, photoinitiators and flexibilizers, dissolved in the pure monomer to accelerate the polymerization process and to improve the quality of the resulting films. Electron acceptors included silver salts, $AgNO_3$, AgTs (Ts=$CH_3(C_6H_4)SO_3^-$, tosylate) and $AgBF_4$, added in amounts of 1–20 mole % (moles electron acceptor)/(moles of monomer+moles of electron acceptor). A thin layer of the formulation is cast and evenly spread on the surface of a selected substrate, such as aluminum, gold, platinum, ceramic, glass, paper, Teflon, Mylar and polystyrene substrates, which is subsequently placed under the output of a UV lamp. Curing is performed under strictly controlled illumination conditions. Multiple coating-curing cycles may be carried out in order to produce thick uniform films.

Solutions of the photopolymerization formulations described above must be stored in glass vials that exclude the penetration of light. However, because a slow chemical polymerization takes place in the presence of $Ag^+$ ions over a period of only about 1–2 days, it is generally desirable to prepare a fresh batch of the photopolymerization formulation immediately prior to use.

Therefore, there is a need for a photopolymerization formulation of pyrrole and/or aniline that can be stored over extended periods of time without polymerizing. It would be desirable if the formulation were concentrated to minimize storage.

SUMMARY OF THE INVENTION

The present invention provides a composition comprising the precipitate obtained by the slow addition of a heterocyclic monomer selected from the group consisting of pyrrole, its substituted derivatives and combinations thereof into a solvent solution comprising $AgClO_4$ and optionally including an electron acceptor selected from the group consisting of $AgNO_3$, $AgCH_3(C_6H_4)SO_3^-$, $AgBF_4$, $SnCl_2$, $SnCl_4$, and mixtures thereof. The preferred solvent is toluene. The composition includes polycrystalline complexes having the formula, $Ag(C_4R_4NH)_2^+ClO_4^-$, wherein R may be H, an organic component or an inorganic component, characterized in that the complex is a dry white powder that will polymerize on exposure to light.

The present invention also provides a composition that may be produced using the polycrystalline complex just described. The composition comprises a substantially low conductivity polymer matrix and silver granules having a diameter between about 0.005 $\mu$m and about 50 $\mu$m distributed in the polymer matrix. The polymer matrix comprises a polymer selected from the group consisting of polypyrrole, its substituted derivatives, and combinations thereof.

The invention also provides a process comprising the steps of: providing a solution of toluene and $AgClO_4$; adding a heterocyclic monomer into the solution to precipitate a polycrystalline complex, such as a silver-pyrrole complex, wherein the heterocyclic monomer is selected from the group consisting of pyrrole, its substituted derivatives and combinations thereof. The process may further include the steps of filtering the polycrystalline complex; washing the polycrystalline complex with toluene; and drying the polycrystalline complex to obtain a powder. The polycrystalline powder is then stored in a dark container until needed. The powder is used by dissolving the polycrystalline powder in a solvent to form a second solution; casting the second solution onto a substrate; and photopolymerizing a portion of the polycrystalline complex. It may be desirable to evaporate the solvent from the second solution to leave a film of the polycrystalline complex prior to photopolymerizing.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1A:
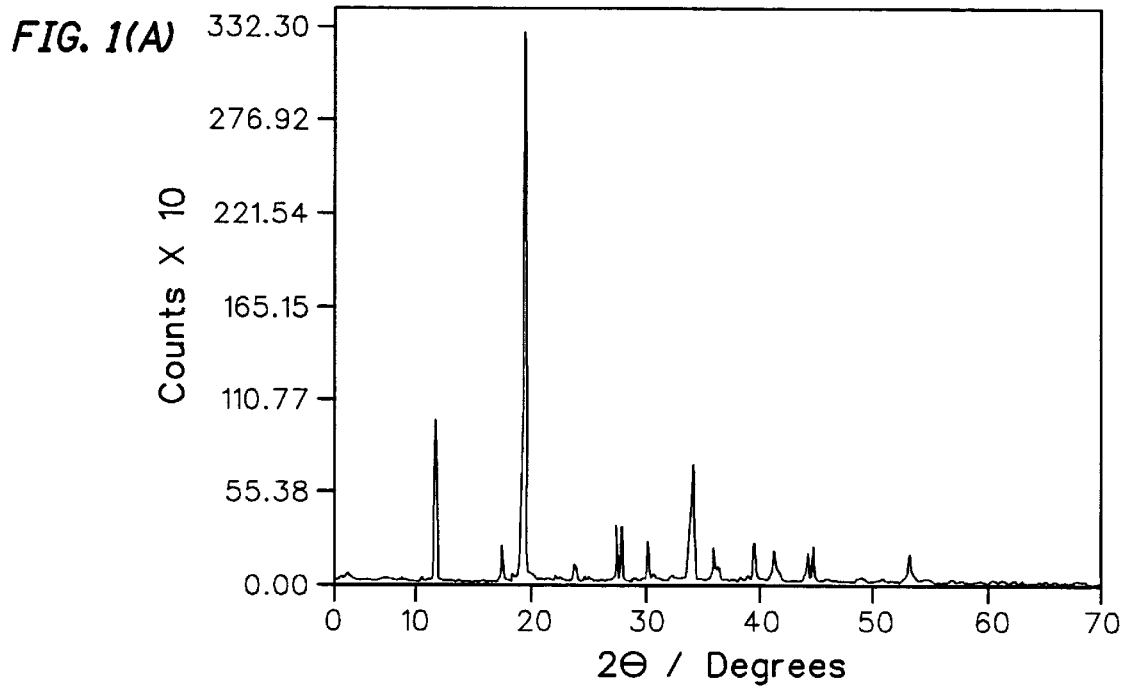
FIG. 1 provides x-ray diffraction (XRD) patterns for the polycrystalline silver-pyrrole complex of the present invention (a) with no illumination; and (b)–(c) after exposure to ultraviolet light.

The present invention provides a polymer composition having well dispersed metal granules, a stable intermediate powder made from photosensitive polycrystalline complexes of a heterocyclic monomer selected from the group consisting of pyrrole, its substituted derivatives and combinations thereof for making the polymer composition, and methods of forming the stable powder and polymer composition, respectively.

In one aspect of the invention, a polycrystalline complex of silver with a monomer, such as pyrrole, is provided in the form of a stable photosensitive powder. The complexes are precipitated upon the slow addition of the monomer to a solvent solution comprising a solvent, such as toluene, and $AgClO_4$.

The reaction forming the polycrystalline complex is slightly exothermic and precipitates at greater than 97% yield of a white, powdery, silver-monomer complex salt $AgX_2^+ ClO_4^-$, where X is preferably pyrrole, its substituted derivatives or a combination thereof. Preferably, the precipitate is filtered and washed with a pure solvent, such as toluene, and dried under a vacuum at room temperature to obtain a dry, white powder. X-ray diffraction spectra of the resulting dry powder shows that it is a highly crystalline compound with no elemental silver, indicating the incorporation of silver cations in the complex. The main advantage of using the powders of the present invention and forming polymer films therefrom, is that the chemicals can be stored in dry form over an extended period and used as needed for the formation of films by simply dissolving the desired quantity in an appropriate solvent.

In another aspect of the invention, a low conductivity organic matrix is provided having generally homogeneously distributed metal granules throughout. The organic matrix is composed primarily of a polymer, such as polypyrrole, its derivatives or combinations thereof, but may also comprise amounts of the polymerizable monomer and by-products of polymerization. The metal granules are preferably silver granules, typically having a diameter in the range of about 0.005 $\mu$m to about 50 $\mu$m. The size, shape and distribution of the metal granules is substantially the same as that of photopolymerized polypyrrole as disclosed in U.S. patent application Ser. No. 08/491,625, now U.S. Pat. No. 5,545,308, which is incorporated by reference herein.

The first step in preparing the low conductivity organic matrix is to dissolve a desired amount of the polycrystalline complex in an appropriate solvent, such as acetone, methanol dimethyl formamide (DMF), dimethyl sulfoxide (DMSO) or N-methylpyrolidine. The solution is then cast over the surface of a substrate by brushing, spraying, spinning or another application technique. Finally, the cast solution is exposed to ultraviolet radiation until a smooth, black film, characteristic of polypyrrole materials, is obtained.

The composition may also be formulated to include additives deemed desirable for modifying certain characteristics of the composition or the formulation used to form the composition. These additives may include, for example, photoinitiators to accelerate the polymerization process, flexibilizers to improve the quality of the resulting films, solubilizers, anionic species, combinations thereof, and their by-products. Additives which are themselves stable, dry powders may be mixed and stored along with the polycrystalline complex. However, other additives should be added to the solution just prior to being cast. Such additives may include other silver or tin salts, such as $AgNO_3$, $AgCH_3(C_6H_4)SO_3^-$, $AgBF_4$, $SnCl_2$, $SnCl_4$, and mixtures thereof, which are generally added to increase the electrical conductivity of the film.

Photopolymerization of the low conductivity polymer films of the present invention is useful in the formation of polymer resist/masks for microcircuit photolithography where high resolution patterned lines can be achieved by argon-ion laser or electron beam exposure of the microcircuit patterns. The same technique can be used for the fabrication of passive electronic components such as resistors or resistor networks having micrometer dimensions. Additives, such as flexibilizers and solubilizers (such as polymethyl methacrylate) can be added to the formulation for increased strength and definition of the patterned lines.

Suitable photoinitiators for use with the present invention include, but are not limited to, a titanocene radical photoinitiator (such as IRGACURE 784 available from Ciba Geigy), a cationic ferrocinium photoinitiator (such as IRGACURE 261 available from Ciba Geigy), and triaryl sulphonium $PF_6^-$ and $SbF_6^-$ salts (such as CYRACURE 6990 and 6974, respectively; both available from Union Carbide). The photoinitiators are added in amounts between about 1 and about 8 wt % (wt photoinitiator/wt of monomer). Suitable additives for improving the mechanical properties of the polymer films include, but are not limited to, large anionic surfactants, such as the sodium salt of dodecyl sulfate (DDS) (available from Aldrich) and the sodium salt of dodecylbenzene sulfonate (DDBS) (available from Aldrich). A suitable flexibilizer is polyethylene glycol diglycidyl ether (available under the trade name DER 736 from Sigma).

Photo-copolymerizations may also be performed in accordance with the invention by adding a comonomer or copolymer to the solvent solution prior to casting the solution onto a substrate. Advantageous co-monomers or copolymers include, but are not limited to, aniline, a perfluoronated sulfonic acid (PFSA) polymer (such as 5 wt % PFSA in a mixture of lower aliphatic alcohols and 10% water; the preferred PFSA is Nafion available from Aldrich), a polyacrylic resin (such as Maincote resin HG 54D available from Rohm and Haas) and a medium viscosity (2100–3600 cps) epoxy resin based on bisphenol A diglycidyl ether (such as Araldite 502 available from Sigma).

EXAMPLES

To illustrate various aspects of this invention, various examples are provided herein. Upon review by those skilled in the art, other specific embodiments that are not specifically illustrated here will become apparent. These embodiments are considered to be part of the present invention.

In these examples, conducting polymer materials were prepared using the photopolymerization process of the present invention. High purity chemicals were used throughout each example. The pyrrole monomer was freshly distilled under vacuum prior to use.

Preparation of Pyrrole-silver Complexes

A silver-pyrrole complex was precipitated by adding distilled pyrrole to a toluene solution of silver perchlorate. 1.034 grams of silver perchlorate ($AgClO_4 {}^*H_2O$) was dissolved in 10 ml of toluene. Then, 1–2 ml of distilled pyrrole was added slowly to the silver perchlorate solution. A white powdery silver-pyrrole complex salt ($AgPy_2^+ClO_4^-$) was instantaneously precipitated. The reaction is slightly exothermic and produces yields greater than 97%. The X-ray spectra showed a highly crystalline compound with no elemental silver peaks present in the spectrum, indicating the incorporation of silver cations in the pyrrole complex. The precipitate was filtered and washed three times with pure toluene, and dried at room temperature.

The solubility of the complexes is important for enabling the powders to be dissolved in a solution which can be cast onto a substrate and photopolymerized into a polypyrrole film. The solubility of the powder was tested by placing 0.5 grams of the complex in 1–2 ml of various solvents. It was determined that the complexes are not appreciably soluble in water, ethanol, and acetonitrile. However, they are soluble in dimethyl formamide (DMF), dimethyl sulfoxide (DMSO), and N-methylpyrolidine, and moderately soluble in acetone and methanol.

The powdery complexes turn gray and eventually black with time when exposed to light. In order to test the sensitivity of the complex to light, the complexes were prepared entirely in a dark room and dried under a vacuum. Upon removal from the dark room and exposure to daylight, a color degradation from white to grayish was visible after about 30 minutes. The gray material remained soluble in all solvents reported above, as well as in acetonitrile. After about 6 hours of daylight exposure, the solubility of the powder decreased, leaving a solution of black polymer particles. Due to the sensitivity of the material to light, the complexes should be stored in dark bottles to prevent polymerization.

Equipment for Photopolymerization of Polymer Films

Photopolymerizations were accomplished with UV light. Two sets of Oriel UV illumination systems, models 66165 and 66002 with 200-watt mercury-xenon arc lamps were used. A collimator with an f/1.0 condensing lens and an additional f/19.7 and 50 mm focal length lenses served to distribute the arc spot to a less than 1 cm diameter sized area. A 90° light beam reflector was employed to direct the light vertically downward on the substrate. All the optical accessories were made of fused silica in order to pass high energy UV as well as visible light The irradiance of the samples was measured by using an Eppley radiometer, model PSP, with a calibrated EMF of 9.38 $10^{-6}$ VW$^{-1}$ m$^2$. Focal lengths were calibrated by marking 11 different positions on the collimator. Typical irradiances and temperatures were measured by means of the Eppley radiometer and an Fe/constantan thermocouple probe respectively. Illumination of up to 2.5 W cm$^{-2}$ and a temperature of 70° C. could be obtained with the light sources used.

Photochemical Preparation of Polymer Films

Castable solutions were prepared by dissolving about 0.1 grams of a polycrystalline complex in about 2 ml of dimethyl formamide. The solutions were cast over an area of one square inch on alumina and fiberglass substrates by brushing and spraying. The cast solutions were then exposed to ultraviolet radiation until smooth, black films were obtained. The black coloration of the film was characteristic of the color found for polypyrrole materials.

The electrical conductivities of photopolymerized films were measured by a four-point probe. An Alessi standard four-point probe was used which consisted of a contact probe station, model CPS-05, that provided a pressure controlled contact of 40–70 grams per tip (C4S-475S probe head) or 70–180 grams per tip (C4S-645S probe head). Low contact resistance was achieved by using osmium tips of 127 μm radii. Spacing between the tips was 1 and 1.5 mm, respectively. Both DC and/or AC current signals were applied in order to compare results and to check for unwanted contact resistances. The four-point probe resistance measurement showed the films as having a resistance of greater than one megaohm (>1 MΩ).

Now referring to FIG. 1, X-ray spectra of this powdered Ag-pyrrole complex, before and after illumination (12 h) are shown. A Rigaka D-maxB or a Scintag PAD-V diffractometers (Texas A&M) were employed, using CuK$_\alpha$ radiation in both cases. The white colored, non-illuminated Ag-pyrrole complex gave an X-ray diffraction pattern, consistent with a single phase polycrystalline material, containing a number of sharp peaks, with no indications of Ag° present in the powder.

Figure 1B:
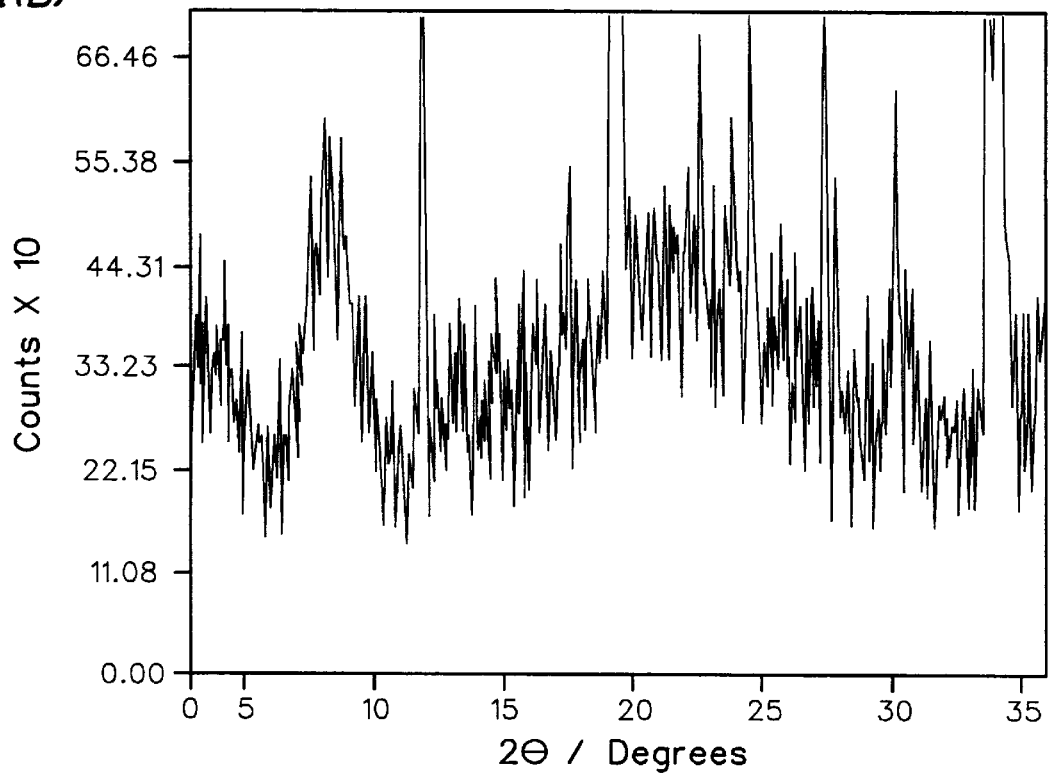
Figure 1C:
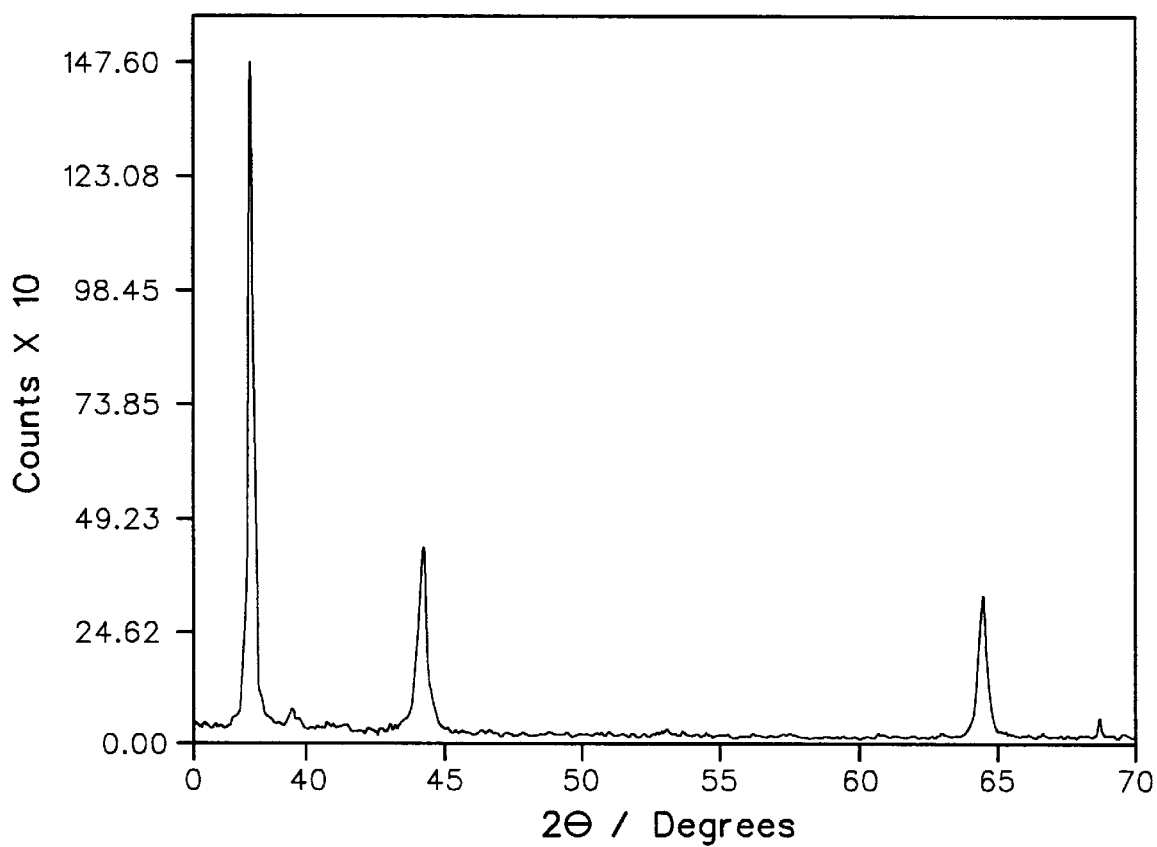

Now referring to FIGS. 1(b) and 1(c), X-ray diffraction spectra of the illuminated and photopolymerized complex are shown. The spectra show a marked decrease in the intensity of the peaks relative to that of the white polycrystalline material shown in FIG. 1(a). Referring specifically to FIG. 1(c), three new peaks appeared, which are characteristic of metallic silver, clearly indicating that a photochemical process involving the white powdered silver-pyrrole complex occurred, where silver cations (Ag$^+$) served as electron acceptors for the oxidation of pyrrole. Referring specifically to FIG. 1(b), the composition is shown to have amorphous structural features, as evidenced by broad maxima at d-spacings of 3.9 Å and 10.6 Å. From these results it is clear that the films contain metallic silver grains that are homogeneously incorporated and evenly distributed within the bulk of photopolymerized polypyrrole.

While the foregoing is directed to the preferred embodiment of the present invention, other and further embodiments of the invention may be devised without departing from the basic scope thereof. The scope of the invention is determined by the claims which follow.

What is claimed is:

1. A process comprising the steps of:

providing a solution comprising toluene and AgClO$_4^-$;

adding a heterocyclic monomer into the solution to precipitate a polycrystalline complex, wherein the heterocyclic monomer is selected from pyrrole, substituted derivatives of pyrrole or combinations thereof;

filtering the polycrystalline complex from the solution;

washing the polycrystalline complex with toluene;

drying the polycrystalline complex to obtain a powder;

dissolving the dry powder in a solvent to form a second solution; and applying the second solution onto a substrate.

2. The process of claim 1, further comprising the step of:

adding an electron acceptor selected from AgNO$_3$, AgCH$_3$(C$_6$H$_4$)SO$_3^-$, AgBF$_4$, SnCl$_2$, SnCl$_4$, or mixtures thereof to the second solution.

3. The process of claim 1, further comprising the step of:

evaporating the solvent from the applied solution to leave a film of the polycrystalline complex.

4. The process of claim 3, further comprising the step of:

photopolymerizing at least a portion of the film of the polycrystalline complex.

5. The process of claim 4, further comprising the step of:

washing the applied solution away from the photopolymerized portion of the film.

6. The process of claim 3, further comprising the step of:

irradiating at least a portion of the film of the polycrystalline complex to initiate photopolymerization.

7. The process of claim 3, further comprising the step of:

exposing at least a portion of the film of the polycrystalline complex to ultraviolet light to initiate photopolymerization.

8. The process of claim 3, further comprising the step of:

exposing at least a portion of the film to a source of radiation selected from laser light, ultraviolet light, visible light or an electron beam to initiate photopolymerization.

9. The process of claim 1, further comprising the steps of:

storing the powder in a dark container.

10. The process of claim 1, wherein the polycrystalline complex comprises a silver-pyrrole complex.

11. The process of claim 1, wherein the powder is substantially white.

12. A composition produced by a process comprising the steps of:

providing a solution of toluene and $AgClO_4^-$;

adding a heterocyclic monomer into the solution to form a precipitate, wherein the heterocyclic monomer is selected from pyrrole, substituted derivatives of pyrrole and combinations thereof; and photopolymerizing a portion of the precipitate.

13. The composition of claim 12, wherein the process further comprises the steps of:

dissolving the precipitate in a solvent to form a second solution;

applying the second solution onto a workpiece; and evaporating the solvent from the applied solution to leave a film of the precipitate.

14. The composition of claim 13, wherein the precipitate comprises a polycrystalline complex of silver and pyrrole.

15. The composition of claim 13, wherein the process further comprises the steps of:

adding an electron acceptor selected from $AgNO_3$, $AgCH_3(C_6H_4)SO_3^-$, $AgBF_4$, $SnCl_2$, $SnCl_4$, or mixtures thereof to the second solution.

16. The composition of claim 12, wherein the step of photopolymerizing includes irradiating at least a portion of the film of the polycrystalline complex.

17. The composition of claim 12, wherein the step of photopolymerizing includes exposing at least a portion of the film of the polycrystalline complex to ultraviolet light to initiate photopolymerization.

18. The composition of claim 12, wherein the step of photopolymerizing includes exposing at least a portion of the film to a source of radiation selected from laser light, ultraviolet light, visible light or an electron beam to initiate photopolymerization.

* * * * *